March 28, 1967 D. J. SOLTZ ETAL 3,311,737

BIDIRECTIONAL DECADE COUNTER

Filed Oct. 22, 1963

INVENTORS.
DANIEL J. SOLTZ
RICHARD J. SPADY

BY Arthur H. Swanson

ATTORNEY.

United States Patent Office 3,311,737
Patented Mar. 28, 1967

3,311,737
BIDIRECTIONAL DECADE COUNTER
Daniel J. Soltz, Elkins Park, and Richard J. Spady, Feasterville, Pa., assignors to Honeywell Inc., a corporation of Delaware
Filed Oct. 22, 1963, Ser. No. 317,984
4 Claims. (Cl. 235—92)

This invention relates to storage devices for digital data signals. More specifically, the present invention relates to digital data counters.

An object of the present invention is to provide an improved digital counter.

Another object of the present invention is to provide an improved bidirectional decade counter.

A further object of the present invention is to provide an improved bidirectional counter having a separate output signal for a maximum count and a minimum count.

A still further object of the present invention is to provide an improved bidirectional counter which is automatically returned to an initial state upon the attainment of either a maximum count or a minimum count.

Still another further object of the present invention is to provide an improved bidirectional counter, as set forth herein, having a simplified operation and construction.

In accomplishing these and other objects, there has been provided, in accordance with the present invention, a bidirectional counter having a first binary counting element arranged to receive input signals to be counted to effect, in combination with signal gating circuits, a selective routing of the input signals under control of separate control signals determinative of the count direction of the counter. The output signals from the first counting element are applied to a plurality of subsequent binary counting elements arranged in succession and interconnected to allow only one of these subsequent elements to be placed in a state different from the other ones thereof. The total count of the counter is the sum of the first counting element and the succeeding plurality of elements.

A better understanding of the present invention may be had when the following detailed description is read in connection with the accompanying drawings, in which.

Figures 1, 2:
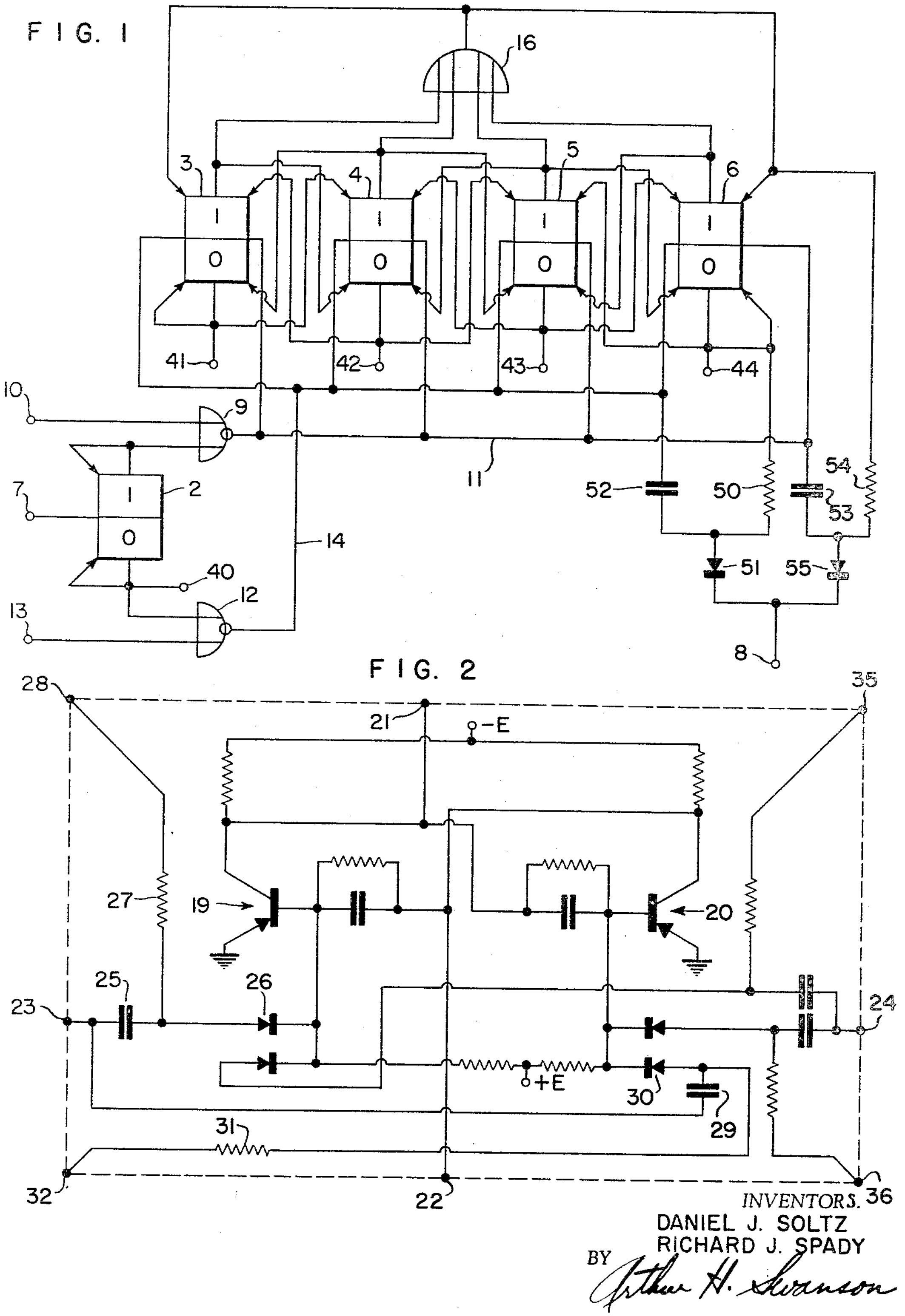
FIG. 1 is a schematic illustration of a bidirectional digital counter embodying the present invention.
FIG. 2 is a schematic illustration of a bistable binary counting circuit suitable for use with the counter shown in FIG. 1.

Referring to FIG. 1, there is shown a bidirectional counter circuit having a plurality of bistable binary counting circuits 2, 3, 4, 5, and 6. A suitable binary circuit for use in this counter is shown in FIG. 2. The schematic representation of FIG. 2 has been arranged to coincide with the binary logic symbol used in FIG. 1. The counter has an input terminal 7 and an end-of-count output terminal 8. The input terminal 7 is arranged to be connected to a source of signals to be counted; e.g., an oscillator. These input signals are applied to the first binary 2 to sequentially change its active state from a "1" side to a "0" side and vice versa. Thus, the first binary 2 produces alternate output signals from the "1" side and the "0" side. The output signal from the "1" side is applied to a NOR gate 9. A second input signal for gate 9 is derived from a first control signal input terminal 10. The NOR gate 9 is arranged to produce an effective gated output signal on an output line 11 when neither of the input signals applied thereto is present. Similarly, the "0" side of the first binary element 2 is connected to a second NOR gate 12. A second input signal for the second gate 12 is obtained from a second control signal terminal 13, and a gated output signal from gate 12 is applied along line 14.

The control signals applied to the terminals 10 and 13 are effective to selectively control the direction of counting of the counter shown in FIG. 1, as discussed hereinafter. Thus, the control signals are selectively applied to determine the effect of input signals applied to input terminal 7. For example, if a control signal is applied to gate 9, the change of state of binary element 2 will be ineffective to produce an output signal on line 11. In other words, a binary change signal is gated by either the NOR gate 9 or gate 12 when the respective gate control signal is terminated. In the above example, there would be no gate control signal applied to gate 12. The successive cycles of the input signal applied to binary element 2 are arranged to successively change the state thereof.

As shown in FIG. 2, the binary element which may be used in FIG. 1 consists of a flip-flop having transistors 19 and 20. The output signal from the "1" side of the flip-flop is connected to an output terminal 21. The output signal from the "0" side is connected to an output terminal 22. The binary circuit may be provided with two similar input terminals 23 and 24. The input terminal 23 is connected through a first capacitor 25 to one side of a first diode 26. This side of the diode 26 is, additionally, connected through a resistor 27 to a "1" side transfer control terminal 28. The input terminal 23 is also connected through a second capacitor 29 to one side of a second diode 30. This side of the second diode 30 is further connected through a resistor 31 to a "0" side transfer control terminal 32. The other remaining sides of diodes 26 and 30 are connected to the input circuits of transistors 20 and 21, respectively.

To provide a binary counting circuit for binary 2 as used in FIG. 1, the output terminals 21 and 22 are connected to control terminals 28 and 32, respectively. This connection is effective to selectively control the application of an input signal on terminal 23 to the flip-flop transistors 19 and 20. Thus, the output signal from the side of the flip-flop that is conducting is used to back bias its related diode to prevent the input signal from being applied to that side of the flip-flop. Conversely, the concurrent absence of an output signal from the other nonconducting side of the flip-flop is effective to permit the input signal to be applied to that side of the flip-flop to change the conducting active state of the flip-flop. In other words, the successive input signals are applied to alternate sides of the flip-flop to successively change the conducting state thereof. Thus, the output signals on terminals 21 and 22 are successively produced to indicate sequential changes in the active state of the binary element from "1" to "0" sides and vice versa. The other input terminal 24, an additional "1" side transfer control terminal 35 and a second "0" side transfer control terminal 36 are provided with associated diode bias circuitry to provide additional independent flip-flop input and transfer controls for use in a bidirectional counting operation of FIG. 1. The operation of these additional circuits is similar to that described above for input terminal 23 and transfer control terminals 28 and 32.

The binary element 2, using the circuit shown in FIG. 1, is connected to change binary states upon successive input signals. Since the gate 12 is connected to the "0" side of the binary 2, the active binary signal is applied to gate 12 when the binary 2 is switched to its "1" side. At this time, this binary signal does not appear on line 14. A binary signal does appear on line 14 when binary element 2 switches from the "1" side to a "0" side and is simultaneously, then, applied as an input signal to binary elements 3, 4, 5, and 6.

The effect of this gated signal is determined by the preceding state of the combination of binary elements 3, 4, 5, and 6. The "1" side of these binary elements are still connected to an OR gate 16 as well as to the other binary elements interconnected in a predetermined arrangement. Similarly, the output signal from the "0" side of binary element 2 is simultaneously applied to all the elements 3, 4, 5, and 6 by means of the other one of binary input terminals. Since the signals on lines 11 and 14 are mutually exclusive, the operation of the counter is dependent on the occurrence of one of these signals and the preceding state of the binary elements.

The counter is arranged to count in the following manner with the positions in the table corresponding to the binary elements 2, 3, 4, 5, and 6:

| | |
|---|---|
| 0=00000 | 5=10100 |
| 1=10000 | 6=00010 |
| 2=01000 | 7=10010 |
| 3=11000 | 8=00001 |
| 4=00100 | 9=10001 |

Utilizing this counting technique, the counter is a decade counter having a maximum count of ten with automatic reset to zero. The change of state of each of the binary elements 2, 3, 4, 5, and 6 is applied to output terminals 40, 41, 42, 43, and 44, respectively, to control the condition of a readout device and provide a digital indication of the count. The operation of the counter circuit is as follows:

Assume the binary elements are all in a "0" state; i.e., the "0" side is in a conducting state, for a total count of zero; and the NOR gate 12 does not have a control signal applied thereto. The first count signal applied to the binary 2 is effective to change the binary state thereof to the "1" side for a count of one. Since a control signal is applied to NOR gate 9, no gate output signal is applied to line 11 and the remaining binary elements 3, 4, 5, and 6 are retained in a "0" state. The next input signal to binary 2 is effective to change the state thereof to a "0" side. The NOR gate 12 has been operative during the "1" state of the binary 2 to gate a signal applied thereto line 14. When the binary 2 is returned to a "0" state, this signal is grated by gate 12, and is applied to the binary elements 3, 4, 5, and 6. This gated signal is effective to affect the binary elements to change their state under control of the transfer circuit of each binary element.

These transfer circuits are interconnected to allow only one of the binary elements 3, 4, 5, and 6 to change its state. In general, the interconnection pattern is from a binary element output line to a transfer control terminal of an opposite type of a preceding and succeeding binary element. More specifically, the transfer terminal of a preceding binary used in the aforesaid connection is on the decreasing count side of the binary element; i.e., the side receiving an input signal from the NOR gates 9 and 12 to decrease the count in counter. Conversely, the transfer terminal used on the succeeding binary is on the side of an input signal for an increase in the count. If there is no succeeding or preceding binary element, as in the case of the first and last elements 3 and 6, the "0" side output is connected to a transfer terminal on the same binary element; i.e., the "0" side output line of the first binary 3 is connected to the transfer terminal on the side receiving an increase count input signal, and the "0" state output line of binary 6 to the decreasing count transfer terminal. The "1" side output lines of the binary elements 3 and 6 are not connected back to the same binary since the remaining transfer terminals on these binary elements receive a joint control signal from the OR gate 16.

The output signal from the counter appearing on terminal 8 is representative of either a completed count of ten or a complete decrease in the count back through zero to nine. In the case of the ten count, the output signal is derived from the increase signal on line 14 from NOR gate 12 when the last binary 6 has been placed in a "1" side active state. This is effected by connecting the "0" side of binary 6 through a resistor 50 to one side of a diode 51 to back bias this diode. This side of the diode 51 is also connected through a capacitor 52 to the line 14. The other side of diode 51 is connected to the output terminal 8. Thus, the back bias signal from the "0" state of binary 6 is effective to prevent the signals on line 14 from appearing on terminal 8 until the last binary 6 is switched to a "1" side.

For a zero to nine decrease count output signal, the output signal is derived from the decrease control line 11 and the output signal level from the OR gate 16. A circuit is used similar to that described above for the ten count. Thus, a capacitor 53 is connected to line 11 and a resistor 54 is connected to the output line of OR gate 16 with the other side of the capacitor 53 and resistor 54 being connected to one side of a diode 55 having its other side connected to output terminal 8. A signal from line 11, accordingly, appears on terminal 8 only when the OR gate 16 produces an output signal level corresponding to having the binary elements 3, 4, 5, and 6 in a "0" state. This output signal from the OR gate 16 is a low level signal whereas the output signal from OR gate 16 corresponding to the presence at least one of the gate input signals is a high level signal suitable for back biasing the diode 55.

Since the binary elements 3, 4, 5, and 6 are in the "0" state, the OR gate 16 is arranged to produce the aforesaid low level output signal indicative of the absence of any of the input signals applied thereto from the "1" sides of the binaries 3, 4, 5, and 6. This output signal from the gate 16 in combination with the aforesaid signal from gate 12 is effective to change the state of the second binary 3 by having the signal level from gate 16 applied to the "1" transfer terminal of the second binary 3. The "1" transfer circuits of the other binaries 4, 5, and 6 are connected to the "0" side output signal of the preceding binary elements. This is effective to prevent the gated signal on line 14 from affecting the "1" side of the other binaries 4, 5, and 6 since the input signal is blocked by the aforesaid application of the existing "0" side state signal. The second binary 3, accordingly, is placed in a "1" state and the other binary elements 2, 4, 5, and 6 are retained in a "0" state for total count of two.

The next change of state of the first binary 2 to a "1" state is ineffective to produce an output singal from gate 12 in a direction to change the state of the binary elements 3, 4, 5, and 6. The first and second binaries 2 and 3 are now in an active state on their "1" sides for a total count of three.

The further operation of the counter for an increasing count is a repetition of the above described operation of binary 2, NOR gate 12 and the binary elements 3, 4, 5, and 6. The further change of state of the binary elements 3, 4, 5, and 6 is controlled by the interconnections thereof to prevent more than one of these binary elements from being in a "1" state and to advance the "1" state through the successive binary elements 3, 4, 5, and 6 in accordance with the count table previously presented. The final state of the counter for a count of ten is a switch from a nine count where binaries 2 and 6 are in a '1" state to a zero state where the binaries are all in a "0" state. This switch automatically returns the counter to an initial state to start a new count. Further, at the initiation of the ten count, an output signal appears on terminal 8 since the back bias signal from binary 6 is removed from diode 51 and the gated signal on line 14 is passed through diode 51.

To decrease the count in the counter, the NOR gate 12 is prevented from gating a binary signal by a control signal applied to terminal 13 while the signal previously applied from terminal 10 to NOR gate 9 is removed. The further operation of binary 2 is effective to gate a signal to line 11 in a manner similar to that described above for gate 12 and line 14. However, line 11 is connected to the other input terminal of binary elements 3, 4, 5, and 6 under control of the other transfer control lines of each binary. Referring to the above example where a count of three, had binary elements 2 and 3 in a "1" state, the next reversal of binary 2 to a "0" state is effective to reduce the count to two, since the NOR gate 12 is inactive and this change of state in binary 2 is ineffective to produce an output signal from NOR gate 9.

The succeeding change of binary 2 to a "1" state is effective to produce a gated signal from NOR gate 9 which is applied to binaries 3, 4, 5, and 6. However, the connections of the "0" sides of 4, 5, and 6 are effective to prevent the signal on line 11 from changing the states thereof. Thus, only binary 3, which has a "0" side transfer circuit open on the side of line 11 is affected by the signal on line 11 and is switched to a "0" side for a total count of one.

The next change of state of binary 2 reduces the count to zero to automatically place the counter in an initial state. The next input signal to binary 2 changes the active state thereof to the "1" side and this change of state is gated by NOR gate 9 to the binary elements 3, 4, 5, and 6. However, only binary element 6 is affected by the gated signal since binary elements 3, 4, and 5 are held in a "0" state by the connections of their transfer circuits. In the case of binary 6, the transfer circuit for the "1" side has been opened by the existing low level signal from gate 16 indicating the binary elements 3, 4, 5, and 6 are in a "0" state. At the same time, this gated signal is effective to produce an output signal on terminal 8. This output signal is the result of the prior change in the OR gate 16 output to a low level whereby to terminate the back bias of diode 55 and to allow the aforesaid gated output signal from NOR gate 9 to appear at terminal 8.

Accordingly, it may be seen that there has been provided, in accordance with the present invention, a bidirectional counter having a separate output signal for a maximum count and a minimum count and arranged to automatically return to an initial condition upon reaching either the maximum or minimum count.

What is claimed is:

1. A counter comprising a plurality of bistable binary elements each having a "0" side output line, a "1" side output line, an input signal line, a "0" side transfer control line, and a "1" side transfer control line, said transfer control lines being arranged to route an input signal on said input signal line to a selected side of said bistable element under control of a transfer control signal applied to either one of said transfer control lines, an OR gate connected to accept an output signal from a selected similar output line from all except a first one of said binary elements, first circuit means connecting an output signal from said OR gate to a "1" state transfer line of a second one of said binary elements, second circuit means connecting said "0" side output line of a second one of said binary elements to said "0" side transfer line of said second one of said binary elements, third circuit means operative to connect an output line of each of said binary elements except the first one and the last one to a single transfer control line of an opposite side on a succeeding one of said binary elements, said first binary element having its input line arranged to be connected to a source of signals to be counted and its output lines to similar ones of its transfer control lines, fourth circuit means operative to supply an output signal from one output line of said first element to all of the input lines of the other ones of said binary elements, and an output signal means operative to provide an output signal representative of a "1" state in a selected combination of said binary elements.

2. A counter as set forth in claim 1 wherein said output signal means includes a diode, a capacitor connected to said fourth circuit means to apply a signal therefrom to pass through said diode, and a resistor connected to apply an output signal from a "0" output line from one of said binary elements to selectively back bias said diode whereby to control the passage of a signal from said capacitor through said diode.

3. A counter as set forth in claim 1 wherein said binary elements except said first element each include a second input signal line, a second "1" side transfer control line and a second "0" side transfer control line, fifth circuit means operative to connect an output line of each of said binary elements except the first and second of said binary elements to a single second transfer control line of an opposite side on a preceding one of said binary elements, a first NOR gate arranged to respond to an output signal from said output line of said first element opposite to the one connected to said fourth circuit means and to a first count control signal, sixth circuit means arranged to apply an output signal from said NOR gate to all of said second input lines of said binary elements, said fourth circuit means including a second NOR gate responsive to an output signal from said first binary element and a second count control signal, said first and second count control signals being mutually exclusive, seventh circuit means connecting a "0" side output line of a last one of said binary elements to said second "0" side transfer line thereof, an eighth circuit means connecting an output signal of said OR gate to said second "1" side transfer control line of a last one of said binary elements, and a second output signal means operative to provide an output signal representative of a "0" state in a selected combination of said binary elements.

4. A counter as set forth in claim 3 wherein said output signal means both include a diode arranged to pass a signal from a corresponding one of said first and second NOR gates and back biased by an output signal representative of the state of a corresponding selected combination of said binary elements.

References Cited by the Examiner

UNITED STATES PATENTS

| | | | |
|---|---|---|---|
| 2,970,761 | 2/1961 | Beranger | 235—92 |
| 3,064,870 | 11/1962 | Butler | 235—92 |

MAYNARD R. WILBUR, *Primary Examiner.*

G. J. MAIER, *Assistant Examiner.*